United States Patent
Ni et al.

(10) Patent No.: US 10,784,366 B2
(45) Date of Patent: Sep. 22, 2020

(54) INTEGRATED ENHANCEMENT/DEPLETION MODE HEMT AND METHOD FOR MANUFACTURING THE SAME

(71) Applicant: Suzhou Han Hua Semiconductor Co., Ltd, Suzhou (CN)

(72) Inventors: Xianfeng Ni, Suzhou (CN); Qian Fan, Suzhou (CN); Wei He, Suzhou (CN)

(*) Notice: Subject to any disclaimer, the term of this patent is extended or adjusted under 35 U.S.C. 154(b) by 0 days.

(21) Appl. No.: 16/398,271

(22) Filed: Apr. 30, 2019

(65) Prior Publication Data

US 2019/0259865 A1 Aug. 22, 2019

(30) Foreign Application Priority Data

Dec. 29, 2018 (CN) .......................... 2018 1 1632766

(51) Int. Cl.
| | |
|---|---|
| *H01L 29/778* | (2006.01) |
| *H01L 29/66* | (2006.01) |
| *H01L 29/20* | (2006.01) |
| *H01L 27/088* | (2006.01) |

(52) U.S. Cl.
CPC ........ *H01L 29/778* (2013.01); *H01L 27/0883* (2013.01); *H01L 29/2003* (2013.01); *H01L 29/66462* (2013.01); *H01L 29/7786* (2013.01)

(58) Field of Classification Search
CPC .............. H01L 29/778; H01L 27/0883; H01L 29/66462; H01L 29/2003; H01L 29/7786
See application file for complete search history.

(56) References Cited

U.S. PATENT DOCUMENTS

| 8,748,244 B1* | 6/2014 | Corrion et al. ........ H01L 21/335 |
| 9,502,245 B1* | 11/2016 | Cheng .................... H01L 21/20 |
| 2011/0210377 A1* | 9/2011 | Haeberlen ............. H01L 29/205 257/194 |

* cited by examiner

*Primary Examiner* — Marcos D. Pizarro
*Assistant Examiner* — Sue Tang
(74) *Attorney, Agent, or Firm* — Westerman, Hattori, Daniels, LLP

(57) ABSTRACT

The present invention provides an integrated enhancement/depletion mode HEMT and a method for manufacturing the same, by which method an enhancement mode transistor and a depletion mode transistor can be integrated together, which is beneficial for increasing the application of gallium nitride HEMT devices and improving the characteristics of circuits, and lay a foundation for realizing monolithic integration of high-speed digital/analog mixed signal radio frequency circuits. At the same time, by using a regrowth technology of a barrier layer, electrons generated by impurities are made part of a conductive channel, thus the concentration of the two-dimensional electron gas is increased, and the conductive performance is improved while preventing excessive electrons from interfering with the devices.

10 Claims, 2 Drawing Sheets

INTEGRATED ENHANCEMENT/DEPLETION MODE HEMT AND METHOD FOR MANUFACTURING THE SAME

CROSS REFERENCE TO RELATED APPLICATIONS

This application is based upon and claims priority to Chinese Patent Application No. 201811632766.6, filed on Dec. 29, 2018 the entire contents of which are incorporated herein by reference.

TECHNICAL FIELD

The present invention relates to the technical field of semiconductor manufacturing, in particular to an integrated enhancement/depletion mode HEMT and a method for manufacturing the same.

BACKGROUND

As a representative of the third generation of semiconductor materials, gallium nitride (GaN) has many excellent characteristics, such as high critical electric field for breakdown, high electron mobility, high two-dimensional electron gas concentration, and good high temperature working ability, etc. The third generation of semiconductor devices based on gallium nitride, such as high electron mobility transistor (HEMT), heterostructure field effect transistor (HFET) and the like, have been put into use, and have obvious advantages especially in areas requiring high power and high frequency such as radio frequency and microwave.

GaN HEMT is mainly used in the communication industry and power electronics industry, but it also has unique advantages in the field of high-speed digital circuits and mixed signals. GaN HEMT has excellent high temperature stability and can greatly reduce the cost of the circuit in terms of heat source and temperature field control. The wide bandgap characteristics of GaN enable it to have both high electron saturation speed and high breakdown voltage, allowing a device to operate at higher voltages, which can improve the driving capability of the circuit. Therefore, compared with the traditional silicon technology, digital circuits based on GaN HEMT can meet the requirements of operating under large current and voltage swings and in harsh environments, making it potentially of great application in corresponding fields.

In order to realize GaN HEMT-based digital circuits, it is necessary to realize monolithic integration of high-performance GaN-based E/D HEMT. Compared with conventional D-mode (depletion mode) GaN HEMT, the E-mode (enhancement mode) GaN HEMT is relatively difficult to manufacture. However, the E-mod GaN HEMT is not only required to realize DCFL logic (Direct-Coupled FET Logic), but also its performance plays a crucial role in the characteristics of the circuit. Therefore, on the basis that the E-mod GaN HEMT is difficult to manufacture, it is even more difficult to realize the monolithic integration of E/D mode HEMT.

SUMMARY

The present invention provides a method for manufacturing an integrated enhancement/depletion mode HEMT, which includes:

providing a substrate, and sequentially forming a buffer layer and a first barrier layer on the substrate;

forming a dielectric layer on the first barrier layer and selectively etching the dielectric layer to expose a portion of the first barrier layer;

performing regrowth on the exposed portion of the first barrier layer to form a second barrier layer, wherein the first barrier layer has a thickness of 1 nm to 30 nm; and removing the dielectric layer, forming a first source, a first drain, and a first gate on the first barrier layer, and forming a second source, a second drain, and a second gate on the second barrier layer.

In one embodiment, the total thickness of the first barrier layer and the second barrier layer does not exceed 100 nm.

In one embodiment, the second barrier layer has a thickness of 1 nm to 99 nm.

In one embodiment, before selectively etching the dielectric layer, a photoresist layer is formed on the dielectric layer, and regions to be etched are defined on the photoresist layer.

In one embodiment, it is characterized in that in the regrowth process, an n-type doping induced by impurities exists on a surface of the exposed portion of the first barrier layer, and electrons generated by the n-type doping become part of a conductive channel after the second barrier layer is formed.

In one embodiment, the material of the dielectric layer is any one of silicon nitride, silicon dioxide and silicon oxynitride.

Correspondingly, the present invention also provides an integrated enhancement/depletion mode HEMT, characterized in that it includes:

a substrate;

a buffer layer on the substrate;

a first barrier layer on the buffer layer and a second barrier layer on the first barrier layer and covering a portion of the first barrier layer, wherein the first barrier layer has a thickness of 1 nm to 30 nm; and a first source, a first drain, and a first gate on the first barrier layer, and a second source, a second drain, and a second gate on the second barrier layer.

According to the integrated enhancement/depletion mode HEMT and the method for manufacturing the same provided by the present invention, an enhancement mode transistor and a depletion mode transistor can be integrated together, which is beneficial for increasing the application of gallium nitride HEMT devices and improving the characteristics of the circuits, and lay a foundation for realizing monolithic integration of high-speed digital/analog mixed signal radio frequency circuits. At the same time, by using the regrowth technology of the barrier layer, electrons generated by impurities are made part of the conductive channel, thus the concentration of the two-dimensional electron gas is increased, and the conductive performance is improved while preventing excessive electrons from interfering with the devices.

DETAILED DESCRIPTION OF THE EMBODIMENTS

An integrated enhancement/depletion mode HEMT and a method for manufacturing the same proposed by the present invention will be described in further detail below with reference to the drawings and specific embodiments. Advantages and features of the present invention will become more apparent from the following description and claims. It should be noted that the drawings are all in a very simplified form and are not to precise scale only for purposes of conveniently and clearly illustrating embodiments of the present invention.

In the present invention, when referring herein to "a layer formed on another layer" may mean that a layer is formed on top of another layer, but it is not necessary that such layer is in direct physical or electrical contact with other layers (e.g., there may be one or more layers between the two layers). However, in some embodiments, the phrase "formed on . . . " may indicate that the layer is in direct physical contact with at least a portion of the top surface of another layer.

Figure 1:
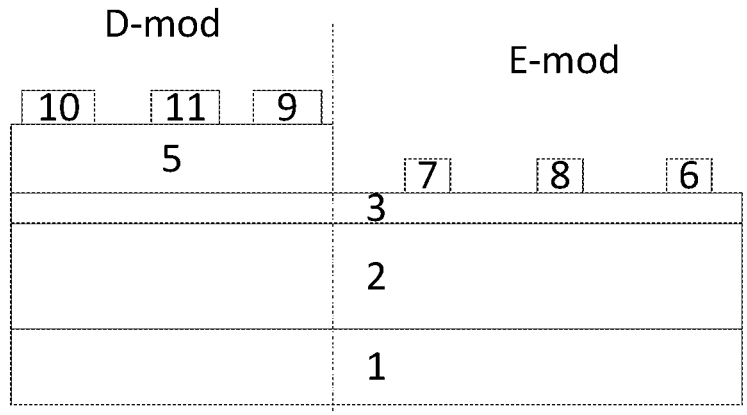
FIG. 1 is a structural diagram of an integrated enhancement/depletion mode HEMT according to one embodiment.
Figure 2:
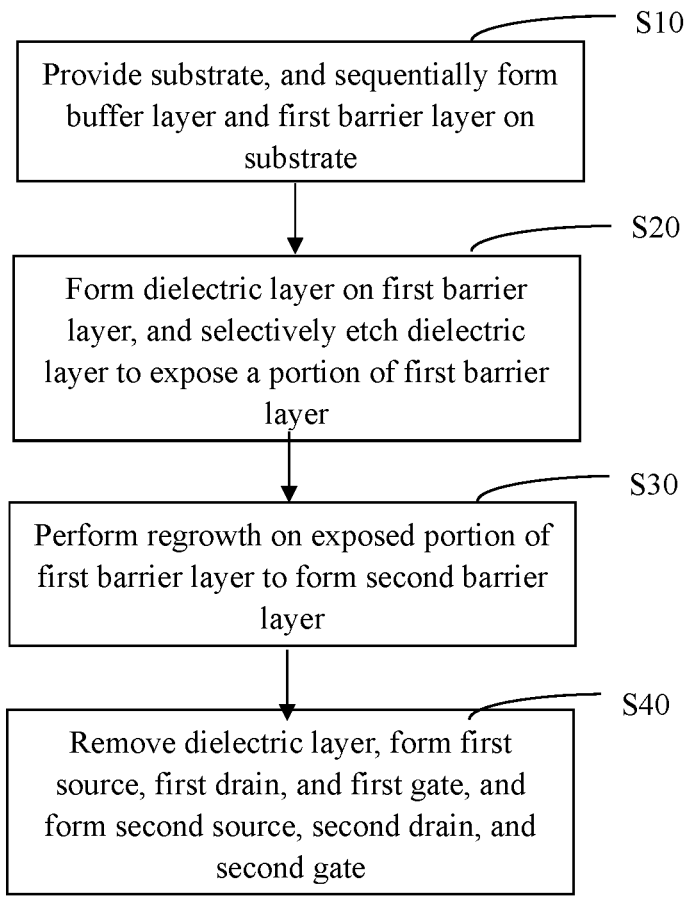
FIG. 2 is a flowchart of a method for manufacturing the integrated enhancement/depletion mode HEMT according to one embodiment.

An integrated enhancement/depletion mode HEMT described in this embodiment has a structure as shown in FIG. 1, including:

substrate 1, buffer layer 2 on substrate 1, first barrier layer 3 on buffer layer 2, and second barrier layer 5 on first barrier layer 3 and covering a portion of first barrier layer 3. The material of substrate 1 includes, but is not limited to, Si, Sic, GaN, sapphire, etc. The material of buffer layer 2 may be a group III metal nitride such as GaN, InN, AlN, AlGaN, InGaN, etc. Buffer layer 2 has a metal-face polarity. For example, if the material of the buffer layer is GaN, then the buffer layer is a Ga-polar GaN buffer layer. On a surface of buffer layer 2 in contact with first barrier layer 3, a two-dimensional electron gas with high electron mobility and high electron density is formed, which serves as a conductive channel to conduct the device. First barrier layer 3 may be a ternary or quaternary nitride compound semiconductor alloy, such as AlGaN, InGaN, etc., with a thickness of 1 nm to 30 nm, depending on the composition part of the ternary or quaternary metal material, such as the composition part of Al in AlGaN. Second barrier layer 5 may be a ternary or quaternary nitride compound semiconductor alloy and may be made of the same material as or a different material from first barrier layer 3. In one embodiment, the material of the first barrier layer may be AlGaN, and the material of the second barrier layer may be InGaN. The second barrier layer has a thickness of 1 nm to 99 nm. The sum of the thicknesses of first barrier layer 3 and second barrier layer 5 shown does not exceed 100 nm.

First source 6, first drain 7, and first gate 8 are provided on first barrier layer 3, and first gate 8 is located between first source 6 and first drain 7. First source 6 and first drain 7 may be any one or a combination of Ti, Pt, Au, W, Ni. First gate 8 may be a metal stack of nickel/gold or platinum/gold. Second source 9, second drain 10, and second gate 11 are provided on second barrier layer 5, and second gate 11 is located between second source 9 and second drain 10. Second source 9 and second drain 10 may be any one or a combination of Ti, Pt, Au, W, Ni. Second gate 11 may be a metal stack of nickel/gold or platinum/gold. When the barrier layer is relatively thinner, the two-dimensional electron gas in the channel may also be cut off when no voltage is applied to the gate, and the channel starts to conduct when a forward voltage is applied to the gate, thus realizing an enhancement field effect transistor (FET). Therefore, first gate 8, first source 6, first drain 7, and the corresponding underlying first barrier layer 3, buffer layer 2, and substrate 1 constitute an enhancement transistor. Second gate 11, second source 9, second drain 10, and the corresponding underlying second barrier layer 5, first barrier layer 3, buffer layer 2, and substrate 1 constitute a depletion mode transistor. In this embodiment, the thickness of the first barrier layer needs to meet the requirements of the enhancement mode transistor, and the sum of the thicknesses of the second barrier layer and the first barrier layer needs to meet the requirements of the depletion mode transistor.

The integrated enhancement/depletion mode HEMT provided by this embodiment can integrate the enhancement mode and depletion mode transistors together, which is beneficial for increasing the application of gallium nitride HEMT devices and improving the characteristics of the circuits and lay a foundation for realizing monolithic integration of high-speed digital/analog mixed signal radio frequency circuits.

Correspondingly, referring to FIGS. 2 to 6, the present application also provides a method for manufacturing an integrated enhancement/depletion mode HEMT, which includes the following steps.

S10: a substrate is provided, and a buffer layer and a first barrier layer are sequentially formed on the substrate.

Figure 3:
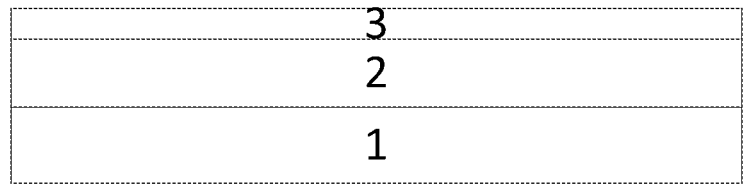
FIGS. 3-6 are schematic diagrams of manufacturing the integrated enhancement/depletion mode HEMT according to one embodiment.

Specifically, as shown in FIG. 3, the material of substrate 1 includes, but is not limited to, Si, SiC, GaN, sapphire, etc. The material of buffer layer 2 may be a group III metal nitride such as GaN, InN, AlN, AlGaN, InGaN, etc. Buffer layer 2 has a metal-face polarity. For example, if the material of buffer layer 2 is GaN, then the buffer layer is a Ga-polar GaN buffer layer. On a surface of buffer layer 2 in contact with first barrier layer 3, a two-dimensional electron gas with high electron mobility and high electron density is formed, which serves as a conductive channel to conduct the device. First barrier layer 3 may be a ternary or quaternary nitride compound semiconductor alloy, such as AlGaN, InGaN, etc., with a thickness of 1 nm to 30 nm.

In order to grow an epitaxial layer, the surface of the substrate may be first cleaned with chemical reagents such as acetone and methanol, and then dried with nitrogen, after that the substrate may be heated to a certain temperature (which can be 100° C. to 120° C.) in a gas environment (hydrogen or nitrogen or a mixed gas of hydrogen and nitrogen) or vacuum by metal organic chemical vapor deposition or molecular beam epitaxy or direct current sputtering, and by controlling the introduction of gas sources having different elements, the buffer layer and the barrier layers can be respectively grown and formed. For example, in the above process, a gas containing a gallium source and ammonia gas are first introduced to form the buffer layer, and on this basis, a gas containing an aluminum source is introduced to form the first barrier layer. The thickness of the first barrier layer may be controlled by controlling the time of growth. The specific thickness of the first barrier layer depends on the composition part of Al in AlGaN and a threshold voltage of the transistor.

S20: a dielectric layer is formed on the first barrier layer, and the dielectric layer is selectively etched to expose a portion of the first barrier layer.

Figure 4:
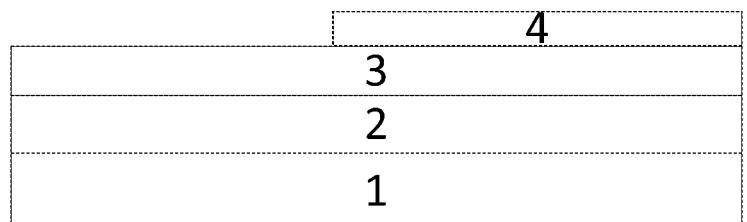

Specifically, dielectric layer 4 may be formed by a chemical vapor deposition method, and the material of dielectric layer 4 includes, but is not limited to, silicon oxide, silicon nitride, and silicon oxynitride. Dielectric layer 4 has a thickness of 1 nm to 1000 nm. Before etching dielectric layer 4, a layer of photoresist may be coated on the dielectric layer, and then regions to be etched are defined on the photoresist layer by exposure, development and the like, and then the photoresist in the regions to be etched and the dielectric layer at corresponding positions may be removed by dry or wet etching to expose a portion of first barrier layer 3. After the etching is completed, the remaining photoresist is removed. The exposed portion of first barrier layer 3 may be continuous or discontinuous. Only the continuous case is shown in FIG. 4. It is understood that this will not hinder the understanding of the scheme by those skilled in the art.

S30: regrowth is performed on the exposed portion of the first barrier layer to form a second barrier layer.

Figure 5:
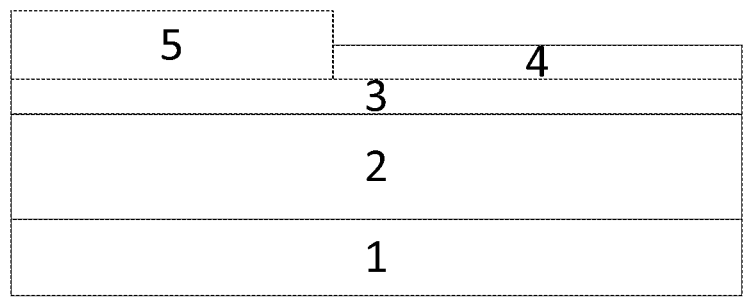

Specifically, referring to FIG. 5, after first barrier layer 3 is exposed, regrowth is performed on the exposed portion of first barrier layer 3 to form second barrier layer 5. Moreover, due to the properties of the material of dielectric layer 4, the regrowth cannot be performed on dielectric layer 4, and therefore second barrier layer 5 will not be formed on dielectric layer 4. In some cases, a polycrystalline material will be formed on dielectric layer 4 during the above process, and the formed polycrystalline material may be removed by a lift-off process. Second barrier layer 5 is formed in the same manner as first barrier layer 3. An n-type doping induced by impurities (silicon ions or oxygen ions) exists at a regrowth interface, and the doping concentration is $1 \times 10^{15}/cm^3$ to $2 \times 10^{19}/cm^3$. After the regrowth is carried out, the second barrier layer will form modulation doping. But due to an energy band difference between the barrier layer and the buffer layer, impurities and electrons will be separated at an interface between the barrier layer and the buffer layer. The electrons enter the channel and become part of the two-dimensional electron gas, thus increasing the concentration of the two-dimensional electron gas while preventing the generation of electrons at the regrowth interface from affecting the cutoff of the device.

S40: the dielectric layer is removed, a first source, a first drain, and a first gate are formed on the first barrier layer, and a second source, a second drain, and a second gate are formed on the second barrier layer.

Figure 6:
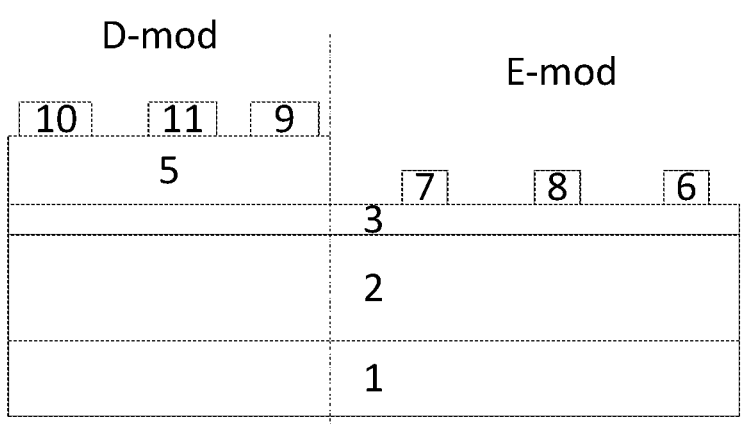

Specifically, dielectric layer 4 may be removed by dry or wet etching, and then first source 6, first drain 7, and first gate 8 are formed on first barrier layer 3, and second source 9, second drain 10, and second gate 11 may be formed on second barrier layer 5 by metal evaporation to form a device structure as shown in FIG. 6. The process of forming the source, the drain and the gate is a well-known technology in the art and will not be further described here.

When the barrier layer is relatively thinner, the two-dimensional electron gas in the channel may be cut off when no voltage is applied to the gate, and the channel starts to conduct when a forward voltage is applied to the gate, thus realizing an enhancement mode FET. Therefore, the first gate, the first source, the first drain, and the corresponding underlying first barrier layer, the buffer layer, and the substrate constitute an enhancement mode transistor. The second gate, the second source, the second drain, and the corresponding underlying second barrier layer, the first barrier layer, the buffer layer, and the substrate constitute a depletion mode transistor.

The technical features of the above-mentioned embodiments can be combined arbitrarily. In order to simplify the description, not all possible combinations of the technical features of the above-mentioned embodiments have been described. However, if there is no contradiction in the combination of these technical features, it should be considered as falling within the scope described in this specification.

The above-mentioned embodiments only represent several embodiments of the present invention, and their descriptions are more specific and detailed, but they should not be construed as limiting the scope of the present invention. It should be pointed out that for those skilled in the art, several modifications and improvements may be made without departing from the concept of the present invention, which are all within the protection scope of the present invention. Therefore, the protection scope of the present invention shall be subject to the appended claims.

What is claimed is:

1. A method for manufacturing art integrated enhancement/depletion mode HEMT, comprising:
   providing a substrate, and sequentially forming a buffer layer and a first barrier layer on the substrate,
   forming a dielectric, layer on the first barrier layer and selectively etching the dielectric layer to expose a portion of the first barrier layer;
   performing a regrowth on the exposed portion of the first barrier layer to form a second barrier layer, wherein an n-type doping induced by impurities exists on a surface of the exposed portion of the first barrier layer, and electrons generated by the n-type doping become a part of a conductive channel after the second barrier layer is formed; and
   removing the dielectric layer, forming a first source, a first drain, and a first gate on the first barrier layer, and forming a second source, a second drain, and a second gate on the second barrier layer.

2. The method for manufacturing the integrated enhancement/depletion mode HEMT according to claim 1, wherein a total thickness of the first barrier layer and the second barrier layer does not exceed 100 urn.

3. The method for manufacturing the integrated enhancement/depletion mode HEMT according to claim 2, wherein the second barrier layer has a thickness of 1 nm to 99 nm.

4. The method for manufacturing the integrated enhancement/depletion mode HEMT according to claim 1, wherein before selectively etching the dielectric layer, a photoresist layer is formed on the dielectric layer, and a region to be etched is defined on the photoresist layer.

5. The method for manufacturing the integrated enhancement/depletion mode HEMT according to claim 1, wherein the first barrier layer has a thickness of 1 nm to 30 nm.

6. The method for manufacturing the integrated enhancement/depletion mode HEMT according to claim 1, wherein a material of the dielectric layer is any one selected from the group consisting of silicon nitride, silicon dioxide, and silicon oxynitride.

7. The method for manufacturing the integrated enhancement/depletion mode HEMT according to claim 1, wherein the material of buffer layer is a group III metal nitride.

8. The method for manufacturing the integrated enhancement/depletion mode HEMT according to claim 1, wherein the first barrier layer is a ternary or quaternary nitride compound semiconductor alloy.

9. The method for manufacturing the integrated enhancement/depletion mode HEMT according to claim 1, wherein the second barrier layer is a ternary or quaternary nitride compound semiconductor alloy.

10. The method for manufacturing the integrated enhancement/depletion mode HEMT according to claim 1 wherein the first source, the first drain, the first gate, the first barrier layer, and the buffer layer constitute an enhancement mode HEMT, and the second source, the second drain, the second gate, the second barrier layer, the first barrier layer, and the buffer layer constitute a depletion mode HEMT.

\* \* \* \* \*